(12) United States Patent
Feierbach

(10) Patent No.: US 7,385,821 B1
(45) Date of Patent: Jun. 10, 2008

(54) COOLING METHOD FOR ICS

(75) Inventor: Gary F. Feierbach, Belmont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 10/020,384

(22) Filed: Dec. 6, 2001

(51) Int. Cl.
*H05K 7/20* (2006.01)

(52) U.S. Cl. ............... 361/705; 361/699; 361/700; 361/715; 361/719; 257/713; 257/714; 257/715; 174/15.1; 165/80.2; 165/80.3; 165/80.4; 165/80.5; 165/104.33

(58) Field of Classification Search ............... 174/15.2; 165/80.3, 80.4, 185, 104.33; 257/713, 714, 257/715; 62/259.2; 361/689–693, 699–701, 361/704, 705, 717–719, 722
See application file for complete search history.

(56) References Cited

U.S. PATENT DOCUMENTS

| | | | |
|---|---|---|---|
| 3,993,123 A | | 11/1976 | Chu et al. |
| 4,138,692 A | * | 2/1979 | Meeker et al. ............... 257/697 |
| 4,203,129 A | | 5/1980 | Oktay et al. |
| 4,254,431 A | | 3/1981 | Babuka et al. |
| 4,323,914 A | | 4/1982 | Berndlmaier et al. |
| 4,450,505 A | * | 5/1984 | Mittal et al. ................. 361/718 |
| 4,561,040 A | * | 12/1985 | Eastman et al. ............ 361/699 |
| 4,712,158 A | * | 12/1987 | Kikuchi et al. ............. 361/699 |
| 4,729,060 A | * | 3/1988 | Yamamoto et al. ......... 361/700 |
| 4,740,866 A | * | 4/1988 | Kajiwara et al. ........... 361/702 |
| 4,750,086 A | * | 6/1988 | Mittal ......................... 361/689 |
| 4,879,629 A | * | 11/1989 | Tustaniwskyj et al. ..... 361/699 |
| 4,910,642 A | * | 3/1990 | Downing .................... 361/690 |
| 4,920,574 A | * | 4/1990 | Yamamoto et al. ......... 361/703 |
| 4,949,219 A | * | 8/1990 | Moriizumi et al. ......... 361/715 |
| 5,050,037 A | * | 9/1991 | Yamamoto et al. ......... 361/699 |
| 5,166,863 A | * | 11/1992 | Shmunis ..................... 361/699 |
| 5,195,020 A | * | 3/1993 | Suzuki et al. ............... 361/699 |
| 5,198,889 A | * | 3/1993 | Hisano et al. .............. 257/678 |
| 5,206,791 A | * | 4/1993 | Novotny ..................... 361/700 |

(Continued)

FOREIGN PATENT DOCUMENTS

GB 2 109 996 A * 6/1983

(Continued)

OTHER PUBLICATIONS

Seri Lee, "How To Select A Heat Sink" Advanced Thermal Engineering, Aavid Thermal Technologies, Inc., 5 pgs., Laconia, New Hampshire 03247.

(Continued)

*Primary Examiner*—Michael Datskovskiy
(74) *Attorney, Agent, or Firm*—Blakely, Sokoloff, Taylor & Zafman LLP

(57) ABSTRACT

The present invention is a cooling device for removing heat from an integrated circuit. In one embodiment, the cooling device includes a conduit and a flexible channel having a first open end and a second closed end. The flexible channel's first open end has an internal width and is coupled with the conduit. The flexible channel is comprised of a resilient material having spring-like characteristics. In one embodiment, this material provides a spring-like restoring force when compressed. The cooling device also includes an interconnect mechanism between the conduit and the flexible channel to allow a gas or a fluid introduced within the conduit to move between the conduit and the flexible channel.

28 Claims, 7 Drawing Sheets

U.S. PATENT DOCUMENTS

| | | | | |
|---|---|---|---|---|
| 5,257,162 A | * | 10/1993 | Crafts | 361/704 |
| 5,390,076 A | * | 2/1995 | Umezawa | 361/689 |
| 5,420,753 A | * | 5/1995 | Akamatsu et al. | 361/719 |
| 5,847,366 A | * | 12/1998 | Grunfeld | 219/497 |

FOREIGN PATENT DOCUMENTS

| | | |
|---|---|---|
| WO | WO 00/03569 | 1/2000 |

OTHER PUBLICATIONS

Aavid Thermalloy, Options Interface Materials, www.aavidthermalloy.com/products/options/interface.shtml, 2 pgs., Oct. 2, 2001.

Aavid Thermalloy, Interface Material-Electrically Conductive -Thermal Greases, www.aavidthermalloy.com/products/options/greases/shtml, 4 pgs., Oct. 2, 2001.

Aavid Thermalloy, Interface Materials-Electrically Conductive-Thermal Adhesives, www.aavidthermalloy.com/products/options/adhesive.shmtl, 3 pgs., Oct. 2, 2001.

Aavid Thermalloy, Interface Materials-Electrically Conductive-Thin Films, www.aavidthermally.com/products/options/films.shtml, 3 pgs., Oct. 2, 2001.

Aavid Thermalloy, Interface Materials-Electrically Isolating-Gap Fillers, www.aavidthermalloy.com/products/options/gapfiller.shtml, 2 pgs., Oct. 2, 2001.

Aavid Thermalloy, Interface Materials-Electrically Isolating-Double Sided Tapes, www.aavidthermalloy.com/products/options/tapes_iso.shtml, 2 pgs., Oct. 2, 2001.

Aavid Thermalloy, Interface Materials-Electrically Isolating-Pads, www.aavidthermalloy.com/products/options/pads.shtml, 4 pgs., Oct. 2, 2001.

Aavid Thermalloy, Options and Accessories-Attachments-PC Board Mounting www.aavidthermalloy.com/products/options/pcboard.shtml, 3 pgs. Oct. 2, 2001.

Aavid Thermalloy, Aavid Thermalloy is the World Leader in the design, development, and production of thermal management systems, www.aavidthermalloy.com/index.shtml, 2 pgs., Oct. 2, 2001.

Aavid Thermalloy, Product Selections, www.aavidthermalloy.com/products/index.shtml, 2 pgs., Oct. 2, 2001.

Aavid Thermalloy, Bonded Fin-Why Bonded Fin? www.aavidthermalloy.com/products/bondfin/whyfin.shtml, 3 pgs., Oct. 2, 2001.

Aavid Thermalloy, Bonded Fin-Frequently Asked Questions www.aavidthermalloy.com/products/bondfin/finfaq.shtml, 3 pgs., Oct. 2, 2001.

Aavid Thermalloy, Assembled Heat Sinks Folded Fin Assemblies, www.aavidthermalloy.com/products/foldedfin/index.shtml, 3 pgs., Oct. 2, 2001.

Aavid Thermalloy, Assembled Heat Sinks, Liquid Cooled Plates, www.aavidthermalloy.com/products/liquid/index.shtml, 2 pgs., Oct. 2, 2001.

Aavid Thermalloy, Options and Accessories, www.aavidthermalloy.com/products/options/index.shtml, 2 pgs., Oct. 2, 2001.

* cited by examiner

COOLING METHOD FOR ICS

FIELD OF THE INVENTION

The present invention relates to cooling or dissipating heat generated by operation of integrated circuits and other electronic devices, and more particularly to methods and apparatus for cooling integrated circuits. More particularly, the present invention relates to techniques and assemblies for integrated circuits that use flexible attachments on pressurized air or liquid cooling heating ducts to make firm contact with the integrated circuit to be cooled.

BACKGROUND OF THE INVENTION

There are numerous assemblies and methods for making and using integrated circuit heat cooling devices in the prior art. For example, the classic technique for removing excess heat from an integrated circuit or other electronic device involves attaching a heat sink to the integrated circuit or other electronic device. This heat sink typically includes a plurality of extruded, planar fins whose large surface area efficiently dissipates heat into the surrounding air or into a coolant circulating inside the fins.

Typically, heat transfer between the hot surface of a heat generating device and the surrounding air is the least efficient means of dissipating excess heat. Use of a heat sink significantly improves this heat transfer by increasing the surface area in contact with the cooling ambient (e.g. air or liquid). As a result, the device's operating temperature is lowered, and its performance reliability and life expectancy are increased.

A thermally conductive path is formed by attaching the heat sink to a surface of the electronic device to be cooled. Typically, this path includes a thermal interface material sandwiched between a contact surface of the heat sink and a contact surface of the electronic device. Depending on the embodiment, the thermal interface material may be malleable, electrically conductive, or electrically isolating. Exemplary electrically conductive thermal interfaces include: thermal greases filled with metallic particles, thermal adhesives, and thin films. Exemplary electrically isolating thermal interfaces include: gap fillers, double sided tapes, and pads. Thermal greases include Sil-Free™, a metal-oxide filled, silicone-free, synthetic grease manufactured by Aavid Thermalloy of Concord, N.H. Sil-Free™ is specially designed for bonding heat sinks to semi-conductor cases, and will not dry out, harden, melt, or run even after long term continuous exposure to temperatures up to 200 degrees Celsius.

Other types of thermal interfaces include silicone-based thermal greases and phase-changing materials. One type of phase-changing material is a solid, silicone-free, paraffin-based thermal compound manufactured by Aavid Thermalloy of Concord, N.H. that changes phase at approximately 60 degrees Celsius, with a concurrent volumetric expansion that fills gaps between the mating surfaces.

Thermally conductive adhesives offer excellent heat transfer and high voltage isolation. Typically manufactured as epoxies that offer low shrinkage and coefficients of thermal expansion comparable to copper or aluminum, thermally conductive adhesives bond readily to metals, glass, ceramics, and most plastics.

Thin films are cost-effective alternatives to thermally conductive grease compounds. Thin films may be applied with commercial hot-stamping equipment to the surfaces of heat producing devices; and such films yield excellent thermal performance while obviating the need for adhesives.

Gap-fillers are "super-soft", low durometer materials designed to fill gaps between hot components and their heat sinks. The flexible elastic nature of gap fillers allows them to blanket uneven surfaces, and to conduct heat away from individual components, or an entire printed circuit board, into metal covers, frames, or spreader plates.

Double-sided tapes may be used to adhere the heat sink to the hot component. They are easily applied, require no curing time, can be electrically conductive or isolating, and require no mechanical support to provide thermal or by physical contact between the heat conductive device and the heat sink.

Thermal interface pads are typically thicker than double sided tapes, but can be provided without adhesive if removal of the pad is necessary. Although pads can be either electrically conductive or insulating, performance of the interface depends on maintenance of correct, constant mounting pressure applied to the pads.

Based on the above discussion, it will be appreciated that a plurality of heat exchangers may be attached to one or more surfaces of an electronic device using mounting clips, adhesives, or extruded pins. It will also be appreciated that the cooling fins, and heat exchangers themselves, may take a variety of configurations. For example, the surfaces of the cooling fins may be flat or dimpled, and the fins themselves may be bonded or folded. Bonded fins tend to dissipate more heat than conventional aluminum heat sinks with the same footprint, and manufacturing techniques permit increased fin ratios of 30:1 and higher. Increasing the number of fins increases the surface area exposed to cooling air, and greater exposed surface area means more heat transferred away from the heat conducting device. Folded fin designs offer maximum cooling surface in minimum volume, and may be manufactured of such materials as aluminum or copper. Liquid-cooled cold plates can provide cooling where air-cooling techniques are impractical or inadequate. Liquid-cooled cold plates dissipate more heat with less flow volume of cooling ambient (as compared to air), maintain better temperature consistency, and create less acoustic noise than air-cooled heat exchangers.

As shown in FIG. 1, a conventional heat sink 100 includes a base material 101 having a contact surface 102 and a finned surface 103. The finned surface 103 is formed of a plurality of planar sections (or fins) 104 that are vertically disposed such that their planar surfaces parallel each other. Typically, adjacent fins are separated by an air channel 105. The air channel 105 develops airflow through the heat sink fins 104. The airflow cools an electronic device attached to the contact surface 102 of the heat sink 100 by dissipating the heat conducted through heat sink 100 and accumulated in fins 104. The base material 101 and fins 104 may be manufactured of any suitable heat-conductive material, such as aluminum.

FIG. 2 shows one example of a prior art liquid-cooled heat exchanger 200. As shown in FIG. 2, the base material 201 and fins 204 may be hollow, or may contain a hollow tube (or tubes) (not shown). A liquid coolant (or fluid) 206, such as water, may be introduced into the hollow base material 201 and/or fins 204, and heated or cooled in order to affect or control the temperature of the electronic device 207 attached to the heat exchanger 200. Alternatively, the liquid coolant 206 may be introduced into the hollow tube (not shown) under pressure, and heated or cooled in order to affect or control the temperature of the electronic device 207 attached to the heat exchanger 200.

In certain applications, however, such as portable computers, factors such as size, weight, and cost are important. However, adding conventional heat sinks to the computer's internal electrical components can increase its size, weight, and cost, thereby making the computer less profitable and less competitive in the marketplace. A significant drawback associated with conventional heat exchangers is the high cost of ensuring the near-perfect co-planarity of the heat exchanger and electrical component mating surfaces. Co-planarity of mating surfaces is important because the more co-planar the two surfaces are, the more efficient the heat transfer. However, it is difficult to manufacture co-planar mating surfaces smooth enough to produce an effective thermal contact.

Because of manufacturing limitations, several techniques and assemblies have been developed that can be used to form an efficient thermal contact between substantially co-planar mating surfaces. For example, a device manufactured by IBM of White Plains, N.Y., uses pistons which drive the heat exchanger (or cylindrical portions of the heat exchanger) down onto a printed circuit board or other electronic device. Although the pressure exerted by the expanding pistons ensures an efficient thermal contact with the heat producing device, such assemblies are expensive to manufacture, expensive to maintain, heavy, and rarely solve any co-planarity issues that might exist when making physical contact with multiple integrated circuits mounted on the heat producing device (e.g. printed circuit board).

Thus, it is desirable to provide an improved, non-conventional cooling device assembly and techniques which may take advantage of a hollow, resilient material having spring-like characteristics that provides a spring-like force when compressed against and in contact with a surface of an integrated circuit or other heat producing device.

SUMMARY OF THE INVENTION

The present invention is a cooling device for removing heat from an integrated circuit. In one embodiment, the cooling device includes a conduit and a flexible channel having a first open end and a second closed end. The flexible channel's first open end has an internal width and is coupled with the conduit. The flexible channel is comprised of a resilient material having spring-like characteristics. In one embodiment, this material provides a spring-like restoring force when compressed. The cooling device also includes an interconnect mechanism between the conduit and the flexible channel to allow a gas or a fluid introduced within the conduit to move between the conduit and the flexible channel.

BRIEF DESCRIPTION OF THE DRAWINGS

The present invention is illustrated by way of example and not limitation in the figures of the accompanying drawings, in which.

DETAILED DESCRIPTION OF PREFERRED EMBODIMENTS

An apparatus and techniques for cooling electronic and electrical devices are disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order to not unnecessarily obscure the present invention.

Figure 1:
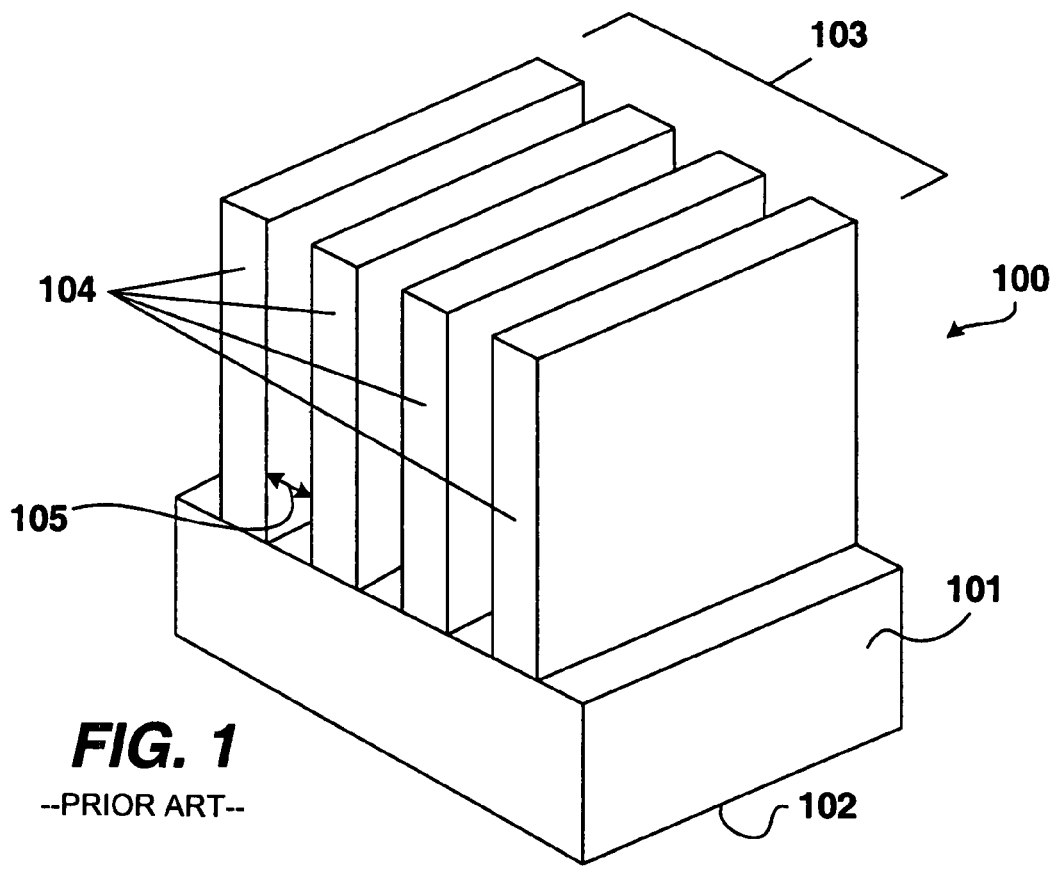
FIG. 1 is a perspective view of a conventional heat exchanger.
Figure 2:
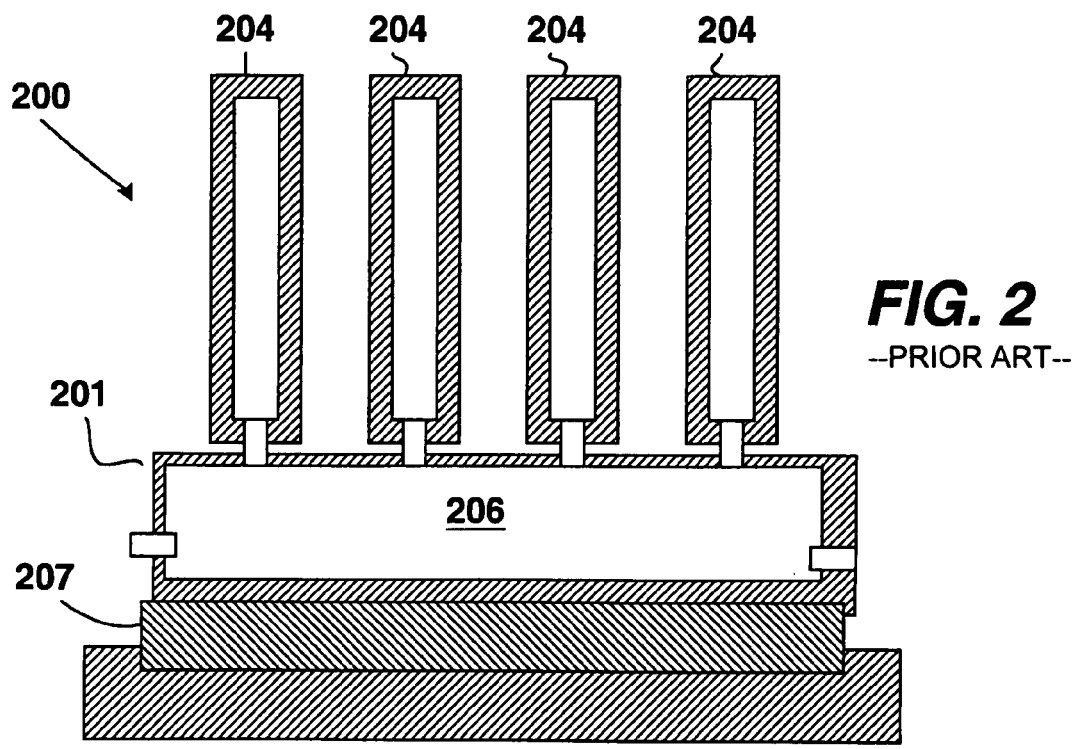
FIG. 2 is a sectional view of a second conventional heat exchanger.
Figure 3:
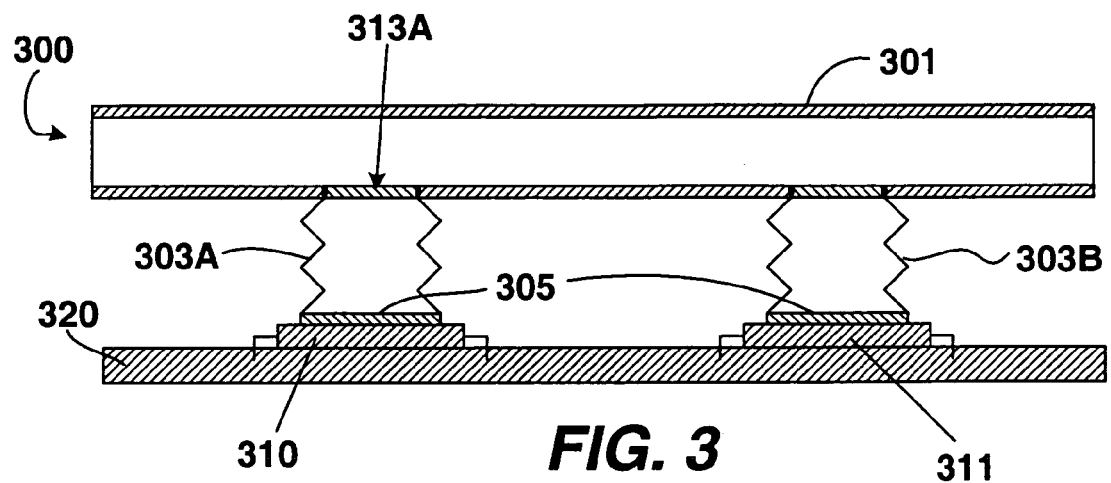
FIG. 3 is a cross-sectional view of a cooling device having flexible channels attached thereto, according to one embodiment of the invention.

FIG. 3 is a cross-sectional view of a cooling device having flexible channels attached thereto, according to one embodiment of the invention. The cooling device 300 shown in FIG. 3 may be formed by any number of methods. For example, the open ends of flexible channels 303A and 303B may be mechanically secured to conduit 301 by a soldering, welding, sautering, or adhering operation. The flexible channels 303A and 303B may be made of a flexible material having spring-like characteristics that produces a spring-like restoring force when compressed. As shown in FIG. 3, the flexible material may be pleated with accordion-like folds. The flexible channels 303A and 303B are shown with corrugated cross-sections which illustrate their resilient or spring-like compressive nature. It will be appreciated that the cross-section of the flexible channel may have a variety of profiles as long as it proves compressible and capable of producing a spring-like restoring force when compressed. Examples of resilient materials that may be used to form the middle portions of flexible channels 303A and 303B include, but are not limited to, phosphor bronze and berillium copper.

Internally, flexible channels 303A and 303B are hollow. Interconnect mechanisms (e.g. an opening) 313A and 313B may be provided in the surface of conduit 301 to allow a fluid, such as a liquid or a gas, to move freely between the interior of conduit 301 and the interior of flexible channels 303A and 303B. The width of the interconnect mechanisms 313 may be the same as or less than the internal width of the flexible channels' open ends.

Each flexible channel 303 has a closed end 305. This closed end is formed by attaching a thermally conductive material to the resilient material forming the middle portion of flexible channels 303A and 303B. Preferably, the thermally conductive material is attached in such a way that closed ends 305 are completely sealed. Various attachment methods may be used, including welding, adhering, soldering, and sautering. Similarly, various thermally conductive materials, well known in the art, may be used. Preferably, however, the thermally conductive material is copper, a copper alloy, or similar metal. The thermally conductive material is manufactured to have a substantially planar exterior surface. Preferably, the exterior surface is as smooth and planar as possible to ensure co-planarity (e.g. as continuous a fit as possible) with the electronic or electrical device to be cooled. Thus, the exterior surface of the thermally conductive material may be polished to a mirror-like finish. In another embodiment, a heat conductive paste may be disposed between the substantially planar exterior surface and the electronic or electrical device to be cooled. This heat conductive paste improves heat transfer by virtually eliminating air pockets trapped between discontinuities in the mating surfaces.

In FIG. 3, the flexible channels 303A and 303B are shown in an extended state and in contact with two integrated circuits (IC's) 310 and 311, which are shown mounted to a printed circuit board (PCB) 320. IC's 310 and 311, are shown packaged with leads soldered to the PCB 320. However, it will be appreciated that IC's 310 and 311 may be modified to accommodate socketed, pin grid array, ball grid array, and other IC technologies, including various packaging technologies. It will also be appreciated that although two flexible channels 303A and 303B and two IC's 310 and 311 are shown, the invention is not so limited. Rather, the invention includes a single flexible channel 303. It also includes more than two flexible channels 303A and 303B in combination with a corresponding number of IC's.

Figure 4:
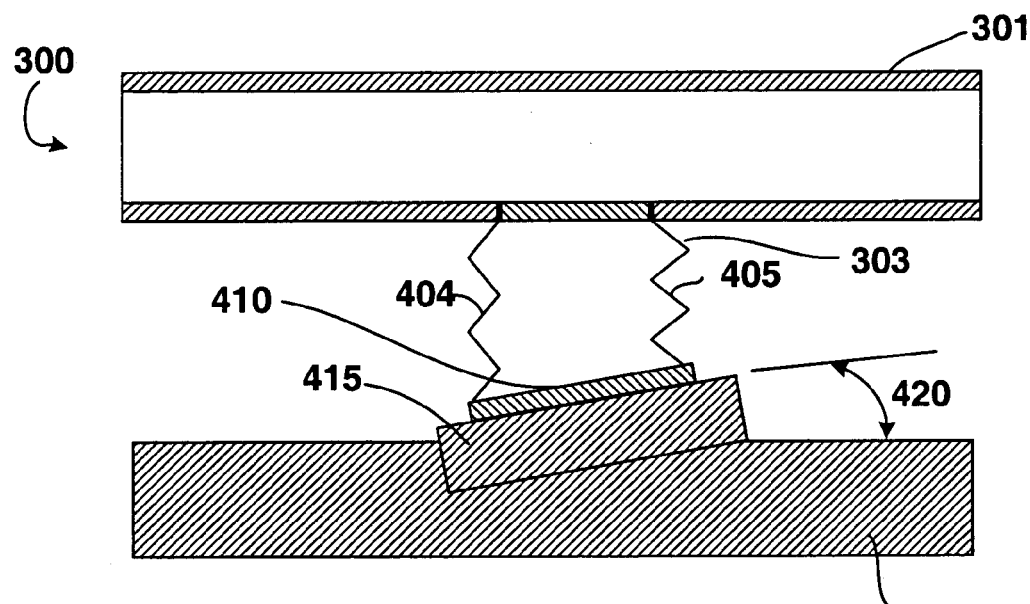
FIG. 4 is another cross-sectional view of a cooling device having flexible channels attached thereto, according to one embodiment of the invention.

FIG. 4 is another cross-sectional view of a cooling device 300 having flexible channels attached thereto, according to one embodiment of the invention. In FIG. 4, a conduit 301 is attached to an open end of a single flexible channel 303. A portion of the closed end of flexible channel 303 (e.g. the exterior surface of thermally conductive material 410) is shown contacting a single IC 415, which is mounted on a PCB 320. In order not to unnecessarily complicate the invention, only a single flexible channel 303 and single IC 415 are shown, but it will be appreciated that the invention may be modified to include a plurality of flexible channels 303A and 303B together with a corresponding plurality of IC's 415. As shown, flexible channel 303 is able to conform to electronic and electrical devices that are not co-planar with the cooling device or that are not co-planar with the printed circuit board.

Illustratively, the co-planarity difference between the closed end of flexible channel 303 and IC 415 is depicted as angle 420. As the closed end of flexible channel 303 contacts a non-coplanar IC or other electronic or electrical device, the resilient, spring-like characteristics of the flexible material forming the middle portion of flexible channel 303 allow the flexible channel 303 to conform to the non-coplanar surface of the IC 415. In this manner, a near uniform compressive force and contact with the surface of the IC 415 are provided. It will be appreciated that the flexible channel 303 varies its dimensional or cross-sectional shape when accommodating a non-coplanar electrical or electronic device. This variation is shown in FIG. 4 as one side 404 of the closed end of flexible channel 303 having been compressed less than the other side 405.

Figure 5A:
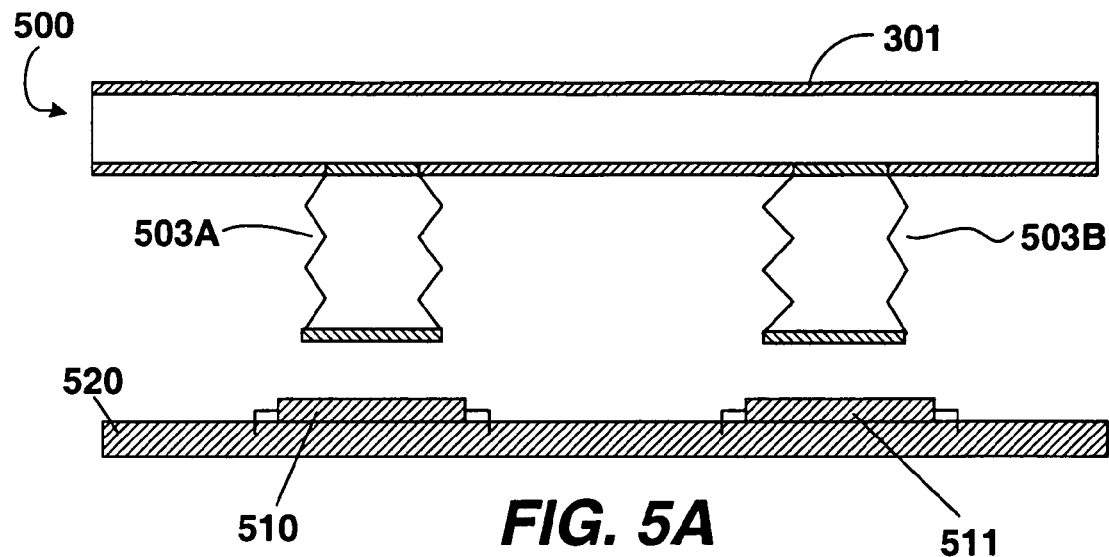
FIG. 5A is a cross-sectional view of a cooling device showing the flexible channels in a first compressed state, according to one embodiment of the invention.
Figure 5B:
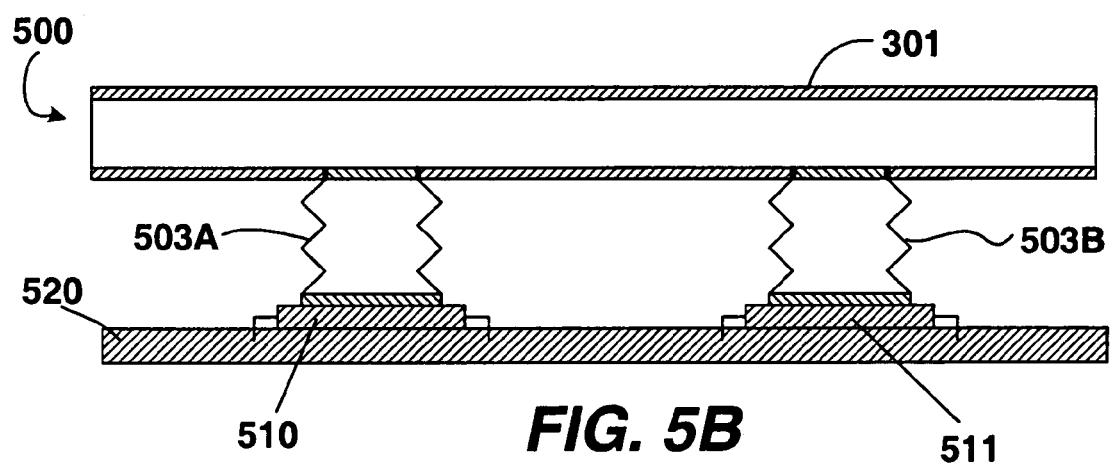
FIG. 5B is a cross-sectional view of a cooling device showing the flexible channels in a second extended state, according to one embodiment of the invention.

FIG. 5A is a cross-sectional view of a cooling device showing the flexible channels in a first resting position, according to one embodiment of the invention. Both FIGS. 5A and 5B show a cooling device 500 positioned over two IC's 510 and 511. In a preferred embodiment, conduit 301 and flexible channels 503A and 503B are not sealed, and the respective interior and exterior pressures are approximately equal. When there is no contact with IC's 510 and 511 or other electronic or electrical devices, the flexible channels will have a natural resting position, such as the extended position illustratively shown in FIG. 5A, due to the spring-like nature of the flexible material forming the middle portions of flexible channels 503A and 503B.

Referring now to FIG. 5B, which is a cross-sectional view of a cooling device 500 showing the flexible channels 503A and 503B in a second operating position, IC's 510 and 511 may be brought into contact with the closed ends of flexible channels 503A and 503B by moving the cooling device 500 toward a PCB 520 that has been fixed to a frame, housing or enclosure. In such an embodiment, the flexible channels compress to conform to the top surface of the IC's 510 and 511, as shown. As the distance between conduit 301 and IC's 510 and 511 decreases, the flexible channels 302A and 302B compresses in comparison to their resting state and their resilient nature produces a spring-like restoring force that pushes the closed ends of flexible channels 503A and 503B towards the top surfaces of IC's 510 and 511. In this manner, a uniform area of contact is provided. Once the flexible channels 503A and 503B contact IC's 510 and 511, the amount of pressure exerted on each IC by flexible channels 503A and 503B may be controlled by variation of the physical proximity of PCB 520 to conduit 301.

Figure 6A:
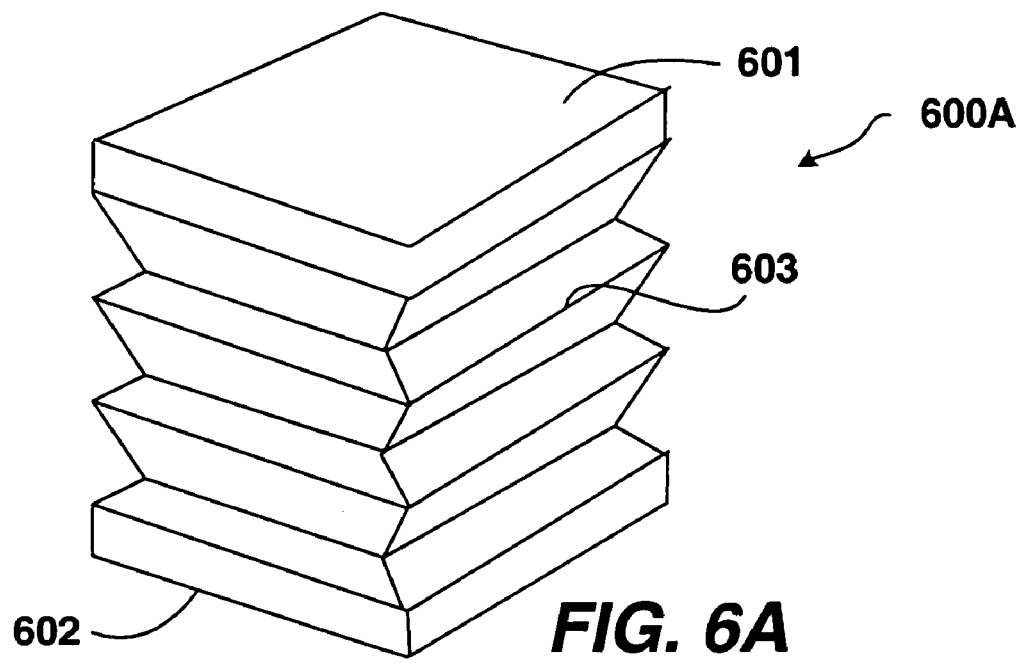
FIG. 6A is a perspective view of a flexible channel, according to one embodiment of the invention.
Figure 6B:
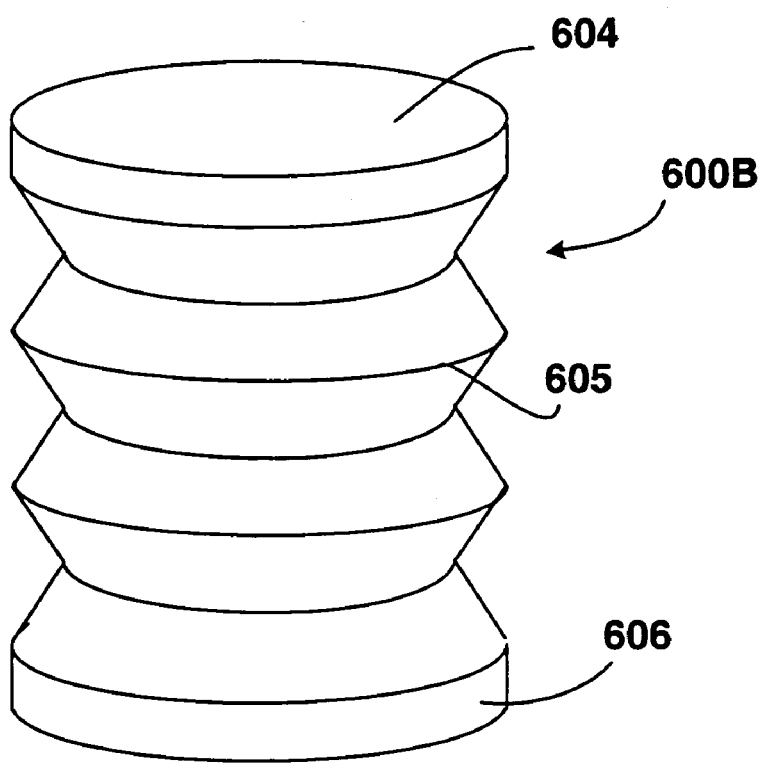
FIG. 6B is a perspective view of a flexible channel, according to another embodiment of the invention.

FIGS. 6A and 6B are perspective views of a flexible channel, according to various embodiments of the invention. FIG. 6A illustrates one embodiment of a flexible channel 600A having a squarish cross-section. Flexible channel 600A includes a closed end 601, a flexible, pleated middle portion 603, and an open end 602, which attaches to a conduit (not shown). Closed end 601 is formed of a thermally conductive material, and the exterior (top) surface of closed end 601 may be substantially planar, as described above. In one embodiment, closed end 601 is attached to flexible, pleated middle portion 603 in such a way that the connection between closed end 601 and flexible, pleated middle portion 603 is sealed (e.g. airtight). In such an embodiment, the connection between open end 602 and a conduit (not shown) may also be sealed. Sealing the connections permits flexible channel 600 to be compressed by creating a vacuum within its interior. The vacuum compressed flexible channel may be extended by equalizing the internal vacuum pressure to approximately equal 1.0 atmosphere.

Alternatively, the connections between closed end 601 and flexible, pleated middle portion 603 and between open end 602 and a conduit (not shown) may be unsealed. In such an embodiment, the flexible, pleated middle portion 603 may occupy a first extended position when not in contact with a device to be cooled. Similarly, when brought into contact with such a device, flexible, pleated middle portion may occupy a second compressed position.

FIG. 6B illustrates another embodiment of a flexible channel 600B having a circular cross-section. In FIG. 6B, flexible channel 600B includes a closed end 604, a pleated middle portion 605, and an open end 606, which attaches to a conduit (not shown). As discussed above, the connections between closed end 604 and flexible, pleated middle portion 605, and between open end 606 and a conduit (not shown), may be sealed, or unsealed, depending upon the embodiment. It will be appreciated that the cross-sectional shape of flexible channel 600 may take a variety of shapes, and is not limited to the illustrative examples depicted in FIGS. 6A and 6B. It will also be appreciated that the dimensions of flexible channel are scalable. However, in a preferred embodiment, closed end 604 has a surface area measuring approximately 2 cm; flexible, pleated middle portion has an inner diameter of approximately 1 cm to approximately 2 cm; and open end 606 has an inner diameter of approximately 2 cm. Similarly, a length of flexible channel 600B, as measured from an edge of closed end 604 to an edge of open end 606, may measure approximately 0.8 cm when extended. When compressed, the length of flexible channel 600B may measure approximately 0.4 cm.

Figure 7:
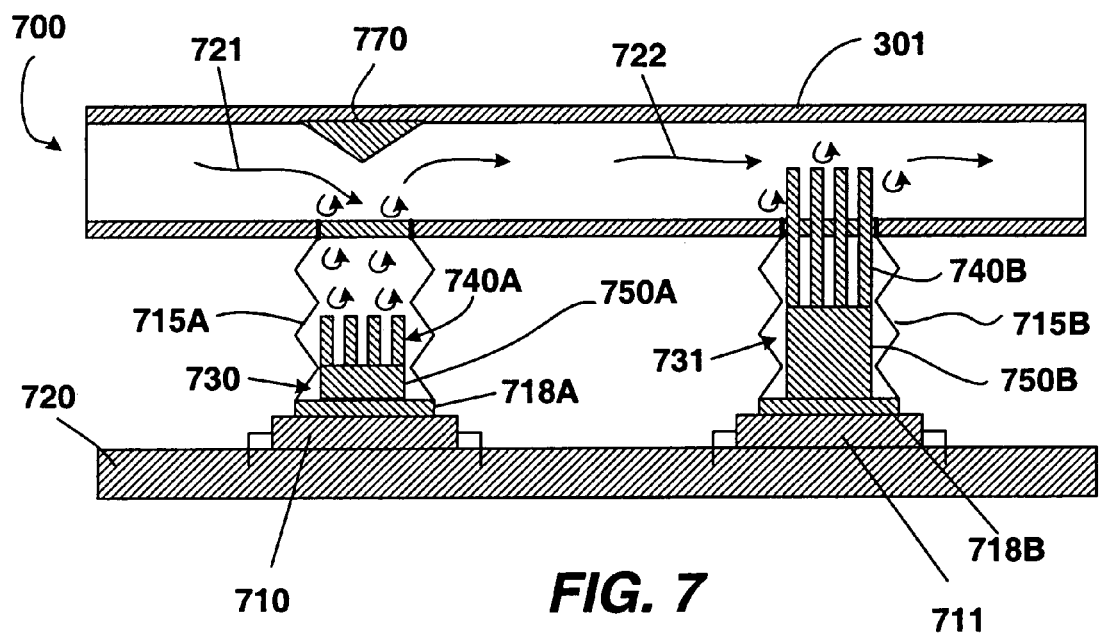
FIG. 7 is a cross-sectional view of a cooling device that includes a flow diverter within the conduit and a heat exchanger within each of the flexible channels, according to another embodiment of the invention.

FIG. 7 is a cross-sectional view of a cooling device 700 that includes a flow diverter 770 within the conduit 301 and a heat exchanger 730 and 731 within each of the flexible channels 715A and 715B, according to another embodiment of the invention. In FIG. 7, a cooling device 700 is positioned over two IC's 710 and 711 mounted on a PCB 720. Flexible channels 715A and 715B have been extended from a first compressed position to contact the top surfaces of IC's 710 and 711. Attached to the inner surface of closed ends 718A and 718B, are two heat exchangers 730 and 731. The heat exchangers 730 and 731 each have base portions 750A and 750B, which mate with the inner surfaces of closed ends 718A and 718B. The heat exchangers 730 and 731 also each have a plurality of fins 740A and 740B, respectively.

A wide variety of thermally conductive materials well known to those skilled in the art may be used to form base portions 750A and 750B and the plurality of fins 740A and 740B. Exemplary materials include, but are not limited to: aluminum, copper, aluminum alloys, copper alloys, and similar thermally conductive materials.

As shown in FIG. 7, the height of fins 740A may be less than the interior length of compressed flexible channel 715A. In such an embodiment, the tips of fins 740B do not break the plane of the conduit's 301 lower wall when flexible channel 715A is compressed. Alternatively, as shown in FIG. 7, the height of fins 750 may be more than the interior length of compressed flexible channel 715B. In such an embodiment, the tips of fins 740B break the plane of the conduit's 301 lower wall when flexible channel 715B is compressed.

Where flexible channels 715A and 715B, and the connections between them and conduit 301, are sealed, a gas or fluid (e.g. liquid such as water or an inert coolant) may be contained within the interior portion of conduit 301 and within the interior portions of flexible channels 715A and 715B. This gas or fluid may be pressurized or not, and may be either heated or cooled using external heating and cooling mechanisms (not shown) coupled with conduit 301. Alternatively, hot or cold air may be contained within the interior portion of conduit 301 and within the interior portions of flexible portions 715A and 715B.

In FIG. 7, the flow of air, gas, or fluid is depicted by arrows 721 and 722. In some embodiments, one or more flow diverters 770 may be attached at various points within conduit 301 to create turbulence in the flow of air, gas, or fluid within the interior portion of conduit 301. Flow diverters 770 may also be attached within the interior portions of flexible channels 715A and 715B. Because heat is dissipated through heat exchangers 730 and 731 into the air, gas, or fluid flowing over and around fins 740A and 740B, creating turbulence provides a more efficient heat transfer by continually mixing cooler air, gas, or fluid with warmer air, gas, or fluid.

Though shown in FIG. 7 as having a triangular cross-sectional shape, it will be appreciated that the cross-sectional shape of flow diverter 770 may take a variety of forms. It will also be appreciated that flow diverter 770 may be formed of a wide variety of materials, including thermally conductive materials such as aluminum and copper, and from non-thermally conductive materials such as plastic, fiberglass, or polymers.

Figure 8A:
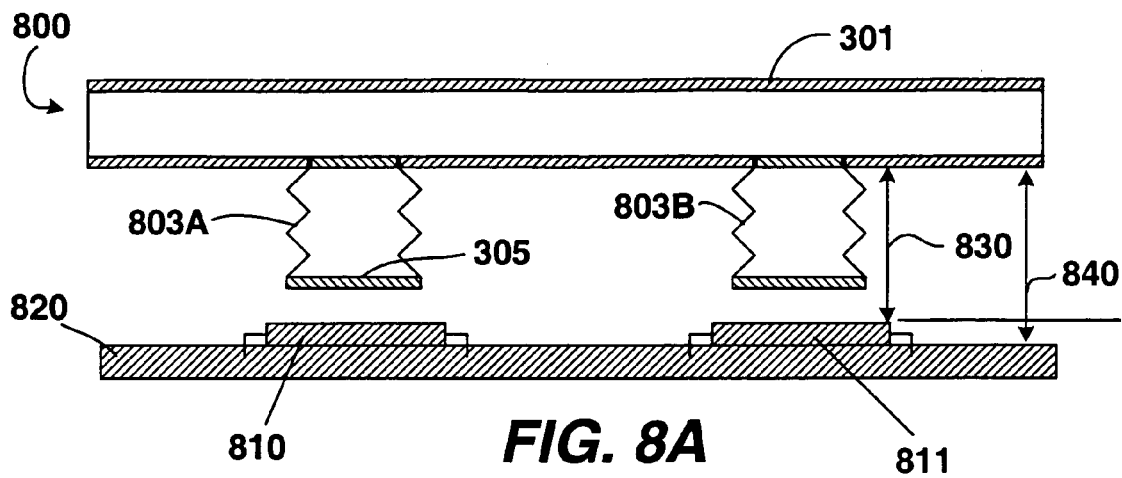
FIG. 8A is a cross-sectional view of a cooling device having flexible channels attached thereto, according to one embodiment of the invention.

FIG. 8A is a cross-sectional view of a cooling device 800 having sealed flexible channels 803A and 803B attached thereto, according to one embodiment of the invention. In FIG. 8A, there is shown a sealed conduit 301 containing a gas under less than 1.0 atmosphere pressure (e.g. a vacuum). Sealed conduit 301 is positioned over two IC's 810 and 811 mounted on a PCB 820. In one embodiment, a complete vacuum may exist within conduit 301 and within flexible channels 803A and 803B, meaning that the interiors of conduit 301 and flexible channels 803A and 803B contain no gas, air, or fluid at all. In FIG. 8A, flexible channels 803A and 803B are shown compressed due to the compressive force of external atmospheric pressure, which is greater than the internal pressure.

When compressed, flexible channels 803A and 803B do not contact the top surfaces of IC's 810 and 811. However, IC's 810 and 811 are positioned a distance 830 from the lower side of conduit 301 so that they can contact flexible channels 803A and 803B when the flexible channels are extended. It will be appreciated that distance 830, as measured vertically from a bottom side of conduit 301 to a top surface of IC 810 or 811, is less than the maximum distance 840 that flexible channels 803A and 803B can be extended. This ensures that flexible channels 803A and 803B will exert sufficient compressive force to ensure the co-planarity needed for an efficient heat transfer.

Figure 8B:
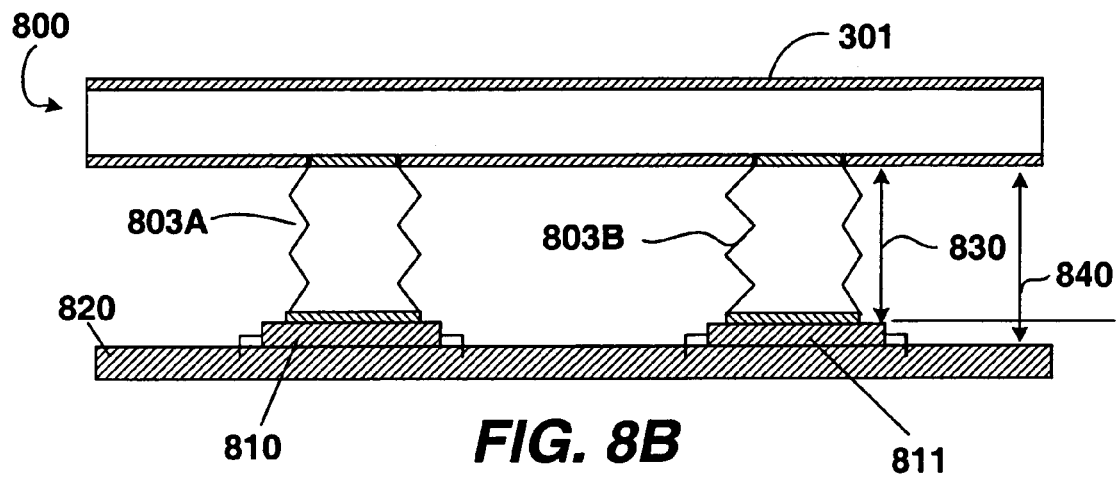
FIG. 8B is a cross-sectional view of a cooling device having flexible channels attached thereto, according to another embodiment of the invention.

FIG. 8B is a cross-sectional view of a cooling device 800 having flexible channels attached thereto, according to another embodiment of the invention. In FIG. 8B, an unsealed conduit 301 is shown positioned above IC's 810 and 811 mounted on a PCB 820, such that flexible channels 803A and 803B contact the top surfaces of IC's 801 and 811, respectively. In FIG. 8B, flexible channels 803A and 803B are shown extended as a result of equalized internal and external atmospheric pressure (e.g. the internal pressure approximately equals 1.0 atmosphere). In the absence of vacuum pressure, the flexible, pleated material forming the middle portions of flexible channels 803A and 803B provides a spring-like restoring force that extends flexible channels 803A and 803B from the compressed position shown in FIG. 8A to the extended position shown in FIG. 8B. When extended, the flexible channels 803A and 803B mate with the top surfaces of IC's 810 and 811, provided of course, that IC's 810 and 811 are positioned a distance 830 from the bottom side of conduit 301 that is less than the maximum distance 840 that flexible channels 302A and 302B can extend.

Referring again to FIG. 8A another embodiment is described. In this embodiment, sealed conduit 301 contains a air, gas, or a fluid, and flexible channels 803A and 803B are formed of a resilient spring-like material that tends to naturally compress, such that flexible channels 803A and 803B occupy the positions shown in FIG. 8A when the internal air, gas, or fluid pressure approximately equals the exterior air pressure of about 1.0 atmosphere.

Referring again to FIG. 8B, conduit 301 remains sealed and the internal air, gas, or fluid pressure is increased to greater than about 1.0 atmosphere to extend the flexible channels 803A and 803B into contact with IC's 810 and 811, which are mounted on a PCB 820 positioned near conduit 301. In this manner, the internal pressure is maintained for as long as needed to cool the IC's 810 and 811. When the internal pressure is lowered to about 1.0 atmosphere or less, flexible channels 803A and 803B retract to the compressed state shown in FIG. 8A.

Various means may be used to compress flexible channels 803A and 803B. Illustratively, an air pump may be used to create a vacuum pressure within the interior of conduit 301 and/or within the interior of flexible channels 803A and 803B. As used herein, the term "vacuum pressure" generally means any interior pressure less than about 1.0 atmosphere that allows flexible channels 803A and 803B to compress due to the external air pressure. Preferably, however, the term "vacuum pressure" means about 0.0 atmosphere. The phrase "not a vacuum pressure", as used herein, means a pressure of about 0.01 atmosphere or greater.

Figure 9:
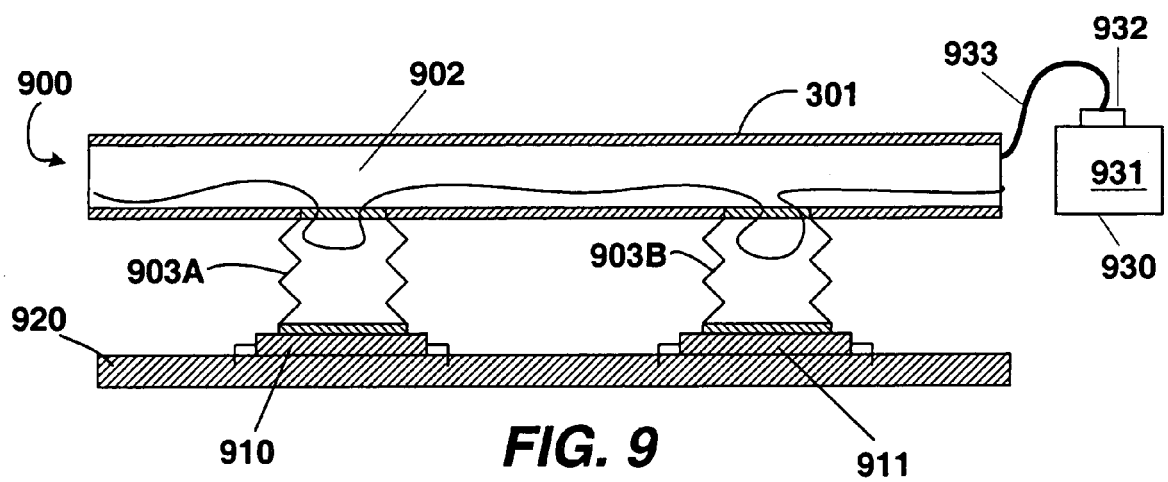
FIG. 9 is a cross-sectional view of another cooling device having a wick therein and having flexible channels attached thereto, according to another embodiment of the invention.

FIG. 9 is a cross-sectional view of another cooling device 900 having a wick 902 therein and having flexible channels 903A and 903B attached thereto, according to another embodiment of the invention. In FIG. 9, conduit 301 is positioned above IC's 910 and 911, which are mounted on a PCB 920. In this embodiment, conduit 301 is a heat pipe, e.g. a tubular structure containing a wick 902 and coupled with a reservoir 930. Reservoir 930 may be mounted on or within conduit 301, or may be external to conduit 301 as shown in FIG. 9. If external, a pump 932 and a connector (e.g. tube or hose) 933 may be provided to couple reservoir 930 with conduit 301. Reservoir 930 may contain a liquid coolant 931 such as water or similar coolants. The coolant 931 is conveyed by capillary action through wick 902 until it is vaporized by the heat transferred through flexible channels 903A and 903B from IC's 810 and 811 (or other electronic or electrical devices). As the vapor reaches cooler portions of heat pipe 301 (e.g. a heat sink attached to heat pipe 301), it cools, condenses, and the condensation is again conveyed by capillary action through wick 902 to flexible channels 903A and 903B.

In this embodiment, the internal pressure approximates the external pressure of about 1.0 atmosphere, and flexible channels occupy a first extended position, as discussed with reference to FIG. 5A, above. IC's 910 and 911 are mounted on a PCB 920. Where cooling device 900 is fixed, PCB is moved such that the top surfaces of IC's 910 and 911 contact and compress flexible channels 903A and 903B, again, as discussed above with reference to FIG. 5B. Alternatively, PCB 920 may be fixedly positioned, and cooling device 900 moved to contact and compress flexible channels 903A and 903B.

Figure 10:
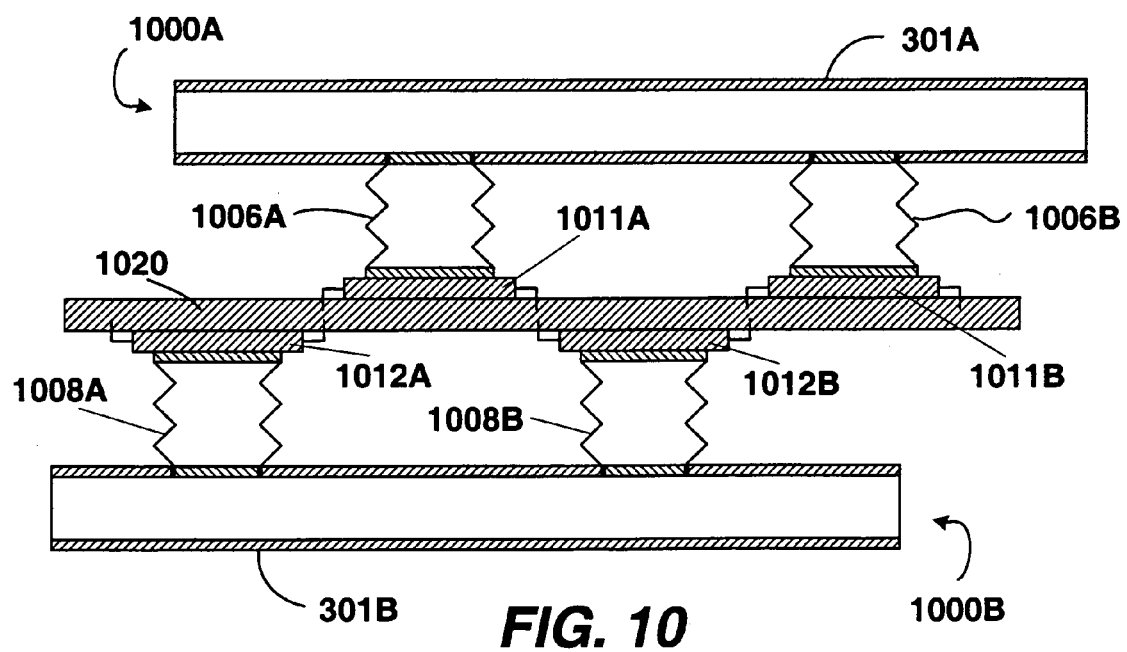
FIG. 10 is cross-sectional view of a plurality of cooling devices, each having a plurality of flexible channels attached thereto, according to another embodiment of the invention.

FIG. 10 is cross-sectional view of a plurality of cooling devices 1000A and 1000B, each having a plurality of flexible channels 1006A, 1006B, 1008A, 1008B, attached thereto, according to another embodiment of the invention. In FIG. 10, a PCB 1020 is positioned between two cooling devices 1000A and 1000B, and has mounted on its top surface IC's 1011A and 1011B. IC's 1012A and 1012B are mounted on the PCB's bottom surface. Cooling device 1000A includes a conduit 301A to which are attached flexible channels 1006A and 1006B. Flexible channels 1006A and 1006B are shown compressively mated with the top surfaces of IC's 1011A and 1011B, respectively. Cooling device 1000B includes a conduit 301B to which are attached flexible channels 1008A and 1008B. Flexible channels 1008A and 1008B are shown compressively mated with the bottom surfaces of IC's 1012A and 1012B, respectively.

Although FIG. 10 only shows two sets of flexible channels and corresponding IC's, it will be appreciated that the invention is not so limited, but that it may include one or more sets of flexible channels and corresponding IC's, depending on the embodiment. In the embodiment shown in FIG. 10, cooling device 1000A and cooling device 1000B are fixedly positioned, while PCB 1020 is movably positioned between them. However, PCB 1020 may be locked into a fixed position just prior to and just after the IC's mounted thereon contact the flexible channels. Before inserting or removing PCB 1020, flexible channels 1006A, 1006B, 1008A, and 1008B should be returned to their compressed states.

Thus, a cooling apparatus and techniques are disclosed. Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. A cooling device for removing heat from an integrated circuit, said cooling device comprising:

a conduit;

a flexible channel to alternate between a compressed position and an extended position and having a first open end and a second closed end, said first open end coupled with said conduit, said open end having an internal width, said flexible channel comprised of a resilient material having spring-like characteristics, said material to provide a spring-like restoring force when compressed, the second closed end comprising a thermally conductive material attached to said flexible channel, said thermally conductive material having a substantially planar surface to interface directly with said integrated circuit when said flexible channel is extended and to detach from said integrated circuit in said compressed position, said flexible channel being conformable with an integrated circuit disposed at an angle relative to the first open end;

an interconnect mechanism between said conduit and said flexible channel to allow a fluid introduced within said conduit to move between said conduit and said flexible channel; and a heat sink attached to an interior surface of said closed end in the compressed position and in the extended position to cause heat absorbed by said closed end to be conducted through said conduit and said flexible channel wherein said heat sink comprises a plurality of spaced apart planar fins wherein a portion of said spaced apart planar fins extends into said conduit in said extended position, the planar fins being perpendicular to a flow of the fluid through the conduit.

2. A cooling device as in claim 1, wherein said interconnect mechanism is an opening in a surface of said conduit.

3. A cooling device as in claim 1, wherein said opening has a width equal to said internal width of said open end.

4. A cooling device as in claim 1, wherein said open end is coupled with said conduit by a technique selected from the group consisting of soldering, sautering, welding, and adhering.

5. A cooling device as in claim 4, wherein said flexible channel, including said closed end, is sealed, and further comprising:
- a port for coupling to a pump coupled to said conduit configured to reduce a pressure in said conduit and said flexible channel to compress said flexible channel and to remove said conductive material from said integrated circuit.

6. A cooling device as in claim 1, wherein said thermally conductive material is copper.

7. A cooling device as in claim 1, wherein said resilient material comprises a material selected from the group of which phosphor bronze and beryllium copper are members.

8. A cooling device as in claim 1, wherein said resilient material is pleated.

9. A cooling device as in claim 1, wherein said flexible channel is in a compressed state.

10. A cooling device as in claim 9, further comprising:
- a vacuum pressure within said conduit and said flexible channel.

11. A cooling device as in claim 9, wherein a pressure within said flexible channel is less than 1.0 atmosphere.

12. A cooling device as in claim 9, wherein said fluid is within said flexible channel.

13. A cooling device as in claim 1, wherein said flexible channel is in an extended state.

14. A cooling device as in claim 13, wherein a pressure within said extended flexible channel approximately equals 1.0 atmosphere.

15. A cooling device as in claim 13, wherein a pressure within said extended flexible channel is not a vacuum pressure.

16. A cooling device as in claim 15, wherein said fluid is contained within said conduit and said flexible channel.

17. A cooling device as in claim 16, wherein said fluid is heated.

18. A cooling device as in claim 16, wherein said fluid is cooled.

19. A cooling device as in claim 16, wherein said closed end contacts said integrated circuit and wherein heat from said integrated circuit is dissipated by said fluid contained within said conduit and said flexible channel.

20. A cooling device as in claim 16, further comprising:
- a plurality of flow diverters attached within said conduit to create turbulence in said fluid.

21. A cooling device as in claim 1, wherein said flexible channel is compressed by creating a vacuum pressure within said flexible channel.

22. A cooling device as in claim 1, wherein said flexible channel is compressed by creating a pressure of less than 1.0 atmosphere within said flexible channel.

23. A cooling device as in claim 1, wherein said flexible channel is extended by equalizing a vacuum pressure within said flexible channel to approximately equal 1.0 atmosphere.

24. A cooling device as in claim 1, wherein said flexible channel is extended by creating a pressure approximately equal to 1.0 atmosphere within said flexible channel.

25. A cooling device as in claim 1 wherein said conduit is a heat pipe.

26. A cooling device as in claim 25, further comprising:
- wicking material contained within said heat pipe; and
- a reservoir coupled with said heat pipe, said reservoir to contain said fluid.

27. A cooling device as in claim 26, wherein said fluid is contained within said heat pipe.

28. A cooling device as in claim 26, wherein a gas is contained within said heat pipe.

\* \* \* \* \*